(12) United States Patent
Bertrand

(10) Patent No.: US 7,750,751 B2
(45) Date of Patent: Jul. 6, 2010

(54) METHOD AND APPARATUS FOR CREATING PHASE MODULATION IN EDGE-SENSITIVE SIGNALS

(76) Inventor: Keith Jay Bertrand, 3475-D Edison Way, Menlo Park, CA (US) 93908

( * ) Notice: Subject to any disclaimer, the term of this patent is extended or adjusted under 35 U.S.C. 154(b) by 136 days.

(21) Appl. No.: 11/371,322

(22) Filed: Mar. 7, 2006

(65) Prior Publication Data

US 2006/0238396 A1 Oct. 26, 2006

(51) Int. Cl.
   *H03C 3/00* (2006.01)
(52) U.S. Cl. .................. 332/146; 332/104; 455/205
(58) Field of Classification Search .......... 332/104, 332/107, 144, 146; 375/283, 308; 455/42, 455/205
   See application file for complete search history.

(56) References Cited

U.S. PATENT DOCUMENTS

| | | | | |
|---|---|---|---|---|
| 3,784,914 A | * | 1/1974 | Aillet | 375/281 |
| 4,479,099 A | * | 10/1984 | Atobe | 332/104 |
| 2006/0208820 A1 | * | 9/2006 | Parsa et al. | 332/103 |

* cited by examiner

*Primary Examiner*—Robert Pascal
*Assistant Examiner*—James E Goodley
(74) *Attorney, Agent, or Firm*—Peninsula IP Group; Douglas A. Chaikin

(57) ABSTRACT

Disclosed herein is a method and apparatus used to add high-performance phase modulation to an applied input signal with data or clock edges which overcomes limitations of range, bandwidth and operating data rate by utilizing parallel devices to singularly modulate rising and falling edges separately and then re-add them together. In an embodiment of this invention, T-type (toggle) flip flops and exclusive-OR gates are used to achieve very high-performance results.

14 Claims, 3 Drawing Sheets

HIGH FREQUENCY PHASE MODULATOR

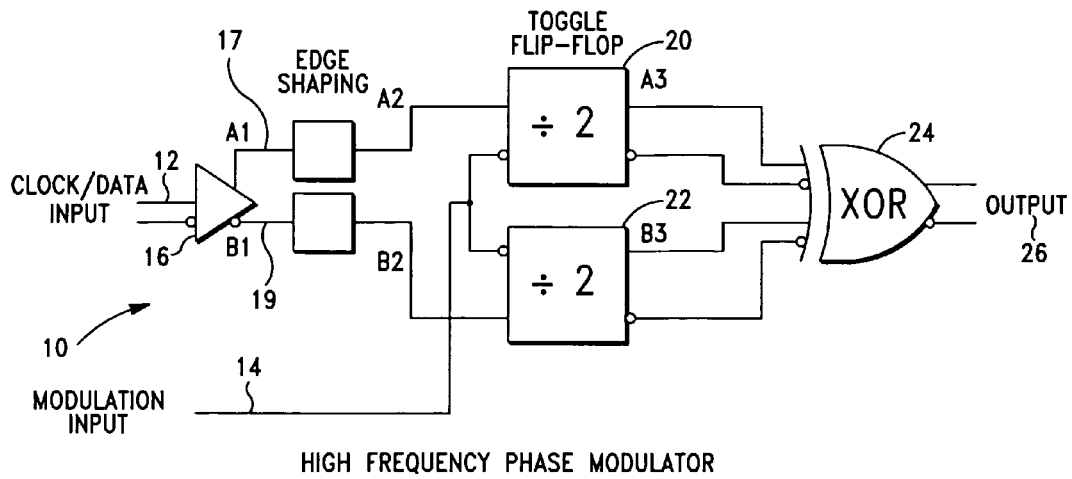
HIGH FREQUENCY PHASE MODULATOR
FIG.−1
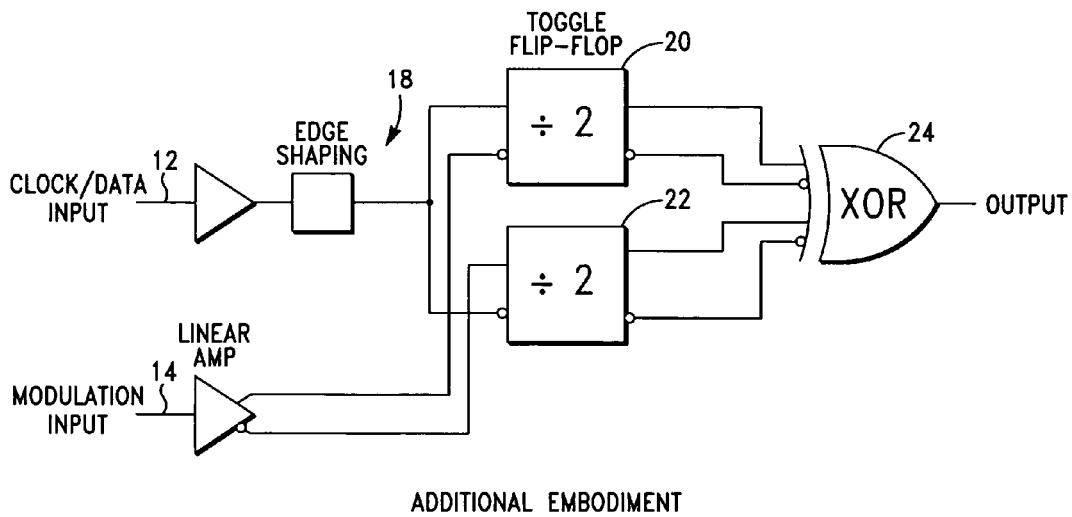
ADDITIONAL EMBODIMENT
FIG.−2

EXAMPLE EDGE SHAPING WITH RANGE IMPACT

METHOD AND APPARATUS FOR CREATING PHASE MODULATION IN EDGE-SENSITIVE SIGNALS

BACKGROUND OF THE INVENTION

1. Field of the Invention

This invention relates to a method and apparatus for phase modulation of the edges of clock or data signals. More particularly, the invention relates to such systems that add phase modulation to signals for the purpose of testing communications components and links.

2. Description of the Related Art

High-performance multi-gigabit (Gbit) per second communications links need to be implemented and tested using mechanisms that are cognitive of the important role that jitter, or phase modulation, causes in a system. When designing links and link components, it is often the case that jitter necessarily present in the signal is desired to be removed by a clock recovery unit specially designed for this task. When testing such devices or links, it is typical to purposefully create signals with high amounts of phase modulation (jitter) to be used as the stimulus during such tests. Whether it is to create a phase modulation inside a phase-locked loop for wide-bandwidth clock recovery or to cause phase modulation in a test stimulus, high-performance phase modulators with sufficient phase variation range, very high speed of modulation (modulation bandwidth) capable of operation for multigigabit per second data rate applications are needed.

Many mechanisms exist for phase modulation including phase interpolators, varacter-based variable delay lines, frequency modulating voltage-controlled oscillators, and limiting amplifier edge threshold modulation. Each has their drawback when compared to the three metrics just mentioned—range, bandwidth and data rate. It is desired to have range that approaches one-half of a data unit period, bandwidth of phase modulation injection that comes close to the bandwidth of the actual clock or data signal being modulated and to operate in application data rates up to and exceeding 12 Gbit/sec.

Phase interpolators are a mechanism that arithmetically adds one signal with an edge to another like signal with the same edge delayed by some prescribed amount (typically delayed by an amount that is less than or equal to the rise time). In this fashion, the output waveform is constructed as a sum as: Output=C1*$Sig_1$+C2 $Sig_2$ (where $Sig_2$ is a delayed copy of $Sig_1$). It is evident that if C1=1 and C2=0, then the output edge will be set by the timing of the edge in $Sig_1$ and that if C1=0 and C2=1, then the output edge will be set by the timing of the edge in Sig2. Smooth functions exist for choosing C1 and C2 between 0 and 1 that cause the output to have a smooth output delay variation from that of $Sig_1$ to that of $Sig_2$. The limits of this approach for implementing phase variation of an output signal stem from the limited range of phase variation supported (limited by the rise time of the signal and the observation that low rise time will translate to added unwanted jitter) and the limited bandwidth possible. The limit in bandwidth in such an implemented system stems from how to apply C1 and C2 to the signals. This can be done with variable amplifiers or variable attenuators both of which do not offer as high a bandwidth control setting as desired.

Varacter-based variable delay lines can also be used to phase modulate a signal. In this approach, the physical observation that the delay of a transmission line is a function of the capacitance of the transmission line and that the capacitance of a transmission line can be voltage-controlled by using a semiconductor component called a varacter (a voltage-variable capacitor). In real implementation of such approaches, scores of varacters are needed to get the change in capacitance requisite to implement the desired range of variable delay. This causes the unwanted side-effect of having to drive a large capacitance at high frequencies when a high-frequency phase modulation is desired. Additionally, because the transfer function between voltage-in and phase variation (delay) out is non-linear requiring signal pre-conditioning in order to achieve the desired linear phase modulation, these types of variable delay technologies have natural limits in the bandwidth of phase modulation that can be supported which are well too low.

For some time now an alternative to phase modulation has been known. It is called sinusoidal frequency modulation. Such modulation is created using a sinusoidal frequency to modulate voltage controlled oscillators. Voltage controlled oscillators are requisite components of phased-lock loops found inside synthesizers and clock recovery units. It is well known to sum a modulation source into the control voltage of the voltage controlled oscillator to cause frequency modulation. There are natural limits to this method. It is known that any allowance for high-frequency modulation of the control voltage inputted to a VCO inside a phased-lock loop also allows noise to be modulated in the VCO, which translates to a large amount of unwanted jitter.

In actuality, the above known described method is really frequency modulation, supported by modulating a VCO's control voltage. This works as a natural limitation to this known method. This type of modulation is not the same as phase modulation except during sinusoidal modulation where the integral of a sine wave is a cosine wave which has a similar amplitude response. Thus, only sinusoidally shaped phase modulation is supported by this known method. As it turns out this is a very significant limitation. Therefore, known methods of frequency modulation of a VCO are severely limited in the type of phase modulation that can be supported.

More recently, attempts have been made to phase modulate clock or data edges using threshold modulation in limiting amplifiers as a means to accomplish high-frequency phase modulation. In this method, the edge of data or clock which is to be modulated (moved back and forth in time) is created by passing the edge through a differential limiting amplifier device. The limiting amplifier behaves in a way such that the output will transition from low to high when one of the differential inputs transition above the other (in voltage) and will reciprocally transition from high to low when one input transitions below the other. When no transitions are present, the limiting amplifier holds a fixed high or low voltage (depending on the comparison of the two differential input voltages). The finite rise-fall times of the applied data or clock edge, makes it possible for the movement of the comparing threshold "upward" (attached to one differential input of the limiting amplifier) to "push off" the point where the input signal (attached to the other differential input of the limiting amplifier) gets above the threshold which delays when the output of the limiting amplifier will change.

Similarly, moving the comparing threshold "downward" will "pull-in" the point where the input signal is above the threshold. This hastens the output of the limiting amplifier and causes it to change earlier than what would be expected. The ability to advance or delay the output edge of the limiting amplifier is sometimes termed an amplitude modulation to phase modulation translation. Changing the threshold amplitude applied as one of the differential inputs changes the output phase. The above structure benefits from the fact that both the inputs to a limiting amplifier typically have the same high-frequency bandwidth. Using this structure, very fast movement of the thresholds can be directly translated to very fast movement of the output phase. This structure is also able to implement linear-like phase modulation for a large percentage of an applied signal (as long as the edge rate of the applied signal is suitably slowed-down—after all, all the modulation range is set by the amount of walking up and down the applied signal edge that can be done on the modulation input). For instance, it is practical to modulate 25% to 30% of a sine-shaped applied input signal while staying within 2-5% linearity. However, it is observed that this technique suffers from the fact that rising edges and falling edges get the same threshold offset applied. The result is that a high threshold will delay a rising edge but will advance a falling edge. The net effect of this is that this approach has proper phase modulation for all rising edges or for all falling edges, but both edges end up creating a modulated duty cycle distortion, an undesirable effect.

Therefore, the method and apparatus in accordance with the instant invention overcomes existing limitations of range, data rate and bandwidth by creating a new phase modulation structure and method.

SUMMARY OF THE INVENTION

An object of the present invention is to create a device and method that phase modulates the edges of an applied clock or data signal within an extended range and/or bandwidth and/or at extended data rates.

It is another object of this invention to use a structure which modulates clock or data edges quickly for the purpose of phase-locked-loop tracking of detected phase modulation.

It is another object of this invention to move, in time, including at high-frequency, to cause or track edge phase modulation.

In order to achieve the objects of the invention, both rising and falling edges of the applied clock or data signal must be suitably modulated in phase simultaneously and in the same direction. Electronic components are used to distinguish between rising and falling edges and phase modulation must be applied separately before reconstituting the output phase modulated signal.

The invention includes a T-type (toggle) flip flop with the specialized ability to only change output state on one edge of the input signal, typically the rising edge. The signal is paralleled to implement high performance phase modulation on both rising and falling edges as one flip-flop is used to toggle based on the direct input signal and another flip flop is used to toggle on an inverted copy of the direct input signal. In this way, one flip flop will react to rising edges of the input and the other will react to falling edges. This separates the processing for each rising or falling edge to different flip flops which allows for parallel processing of rising and falling edges.

Using the method in accordance with the invention, the signal is applied to two T-type flip flops. One is connected directly and the other is connected to an inverted copy of the applied signal. The first flip flop will toggle when rising edges are present and the other flip flop will toggle when falling edges of the applied signal are present. The modulation input connects simultaneously to the other differential input of the T-type flip flop (the thresholds).

Thus a rising threshold on the direct flip-flop will tend to delay the rising output transition. Similarly, a rising threshold on the inverted flip-flop will also tend to delay the falling output transition. The result of both T-type flip flops are then re-combined using an exclusive-OR gate to create an output signal whose edges are phase modulated properly.

The range of the applied modulation in this case depends on the length of the near-linear comparison zone of the applied modulation voltage compared to the input edge transition. Various signal pre-conditioning can be done to extend this range to allow phase modulation. The range in at least exemplary embodiment was found to be well over 25% of the edge period. Multiple stages of the modulator in accordance with this invention are connected in series to extend the range further.

The method of this invention is not dependent on clock or data edge frequency. This independence allows the apparatus in accordance with the invention to process both high and low frequency data rate applications.

As data rate frequency decreases, and the edge rates become as slow as they can be preconditioned to operate, phase modulation in accordance with the invention is still possible. However, under these circumstances, there is a decrease in modulation range introduced by the smaller near-linear comparison zone.

The data rate for the method and apparatus in accordance with this invention is as fast as the ability of the T-type toggle flip flops process and exclusive-OR gates can operate. In practice, the operating speed of an actual embodiment, using the method and apparatus in accordance with the invention, exceeds 20 Gbit/sec. The processing speed increases as the speed of the components in integrated circuit increases. It will be appreciated that present development in such components indicates that such speed will continue to increase.

The bandwidth restriction from the method in accordance also benefits from using the alternate input of the differential input T-type flip flop as the modulation input. The differential input has the same level of high-performance as the applied data or clock edges and consequently the input has the same input bandwidth for comparison. An effective bandwidth reduction occurs when the circuit or layout fixed delays between signal paths on each T-type flip flop are not matched (for either the applied data or clock signal as well as for the modulation input signal).

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein:

FIG. 1 is a schematic representation of one exemplary embodiment of the phase modulation circuit in accordance with the present invention.

FIG. 2 illustrates a schematic representation of another exemplary implementation of the phase modulation circuit in accordance with the invention.

DETAILED DESCRIPTION OF THE INVENTION

Figure 3:
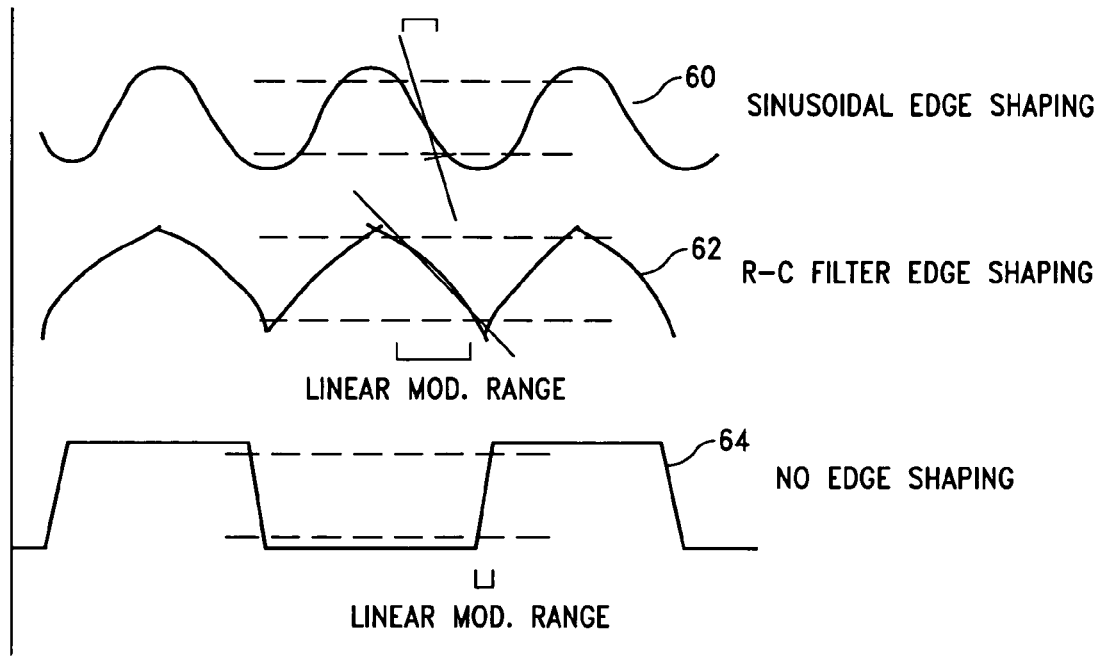
FIG. 3 illustrates a schematic representation of the effect of edge shaping on linear range of modulation.

The present invention will now be described in greater detail with reference to the accompanying drawings, in which the preferred embodiments of the invention are shown. The present invention may, however, be embodied in many different forms and should not be construed as limited to the embodiment set forth herein; rather these embodiments are provided so that this disclosure will be thorough and complete and will fully convey the invention to those skilled in the art.

FIG. 1 illustrates in schematic block diagram form, one exemplary embodiment of the apparatus of this invention, namely a phase modulation circuit, generally designated by the numeral 10. The apparatus 10 includes an input clock signal 12 serving as a data signal, an input modulation signal 14, a differential limiting amplifier 16, edge-shaping circuits, generally indicated by numeral 18, two toggle-type T-flip flops 20 and 22 and an exclusive-OR gate 24. As will be understood more fully with respect to FIG. 5, signals A1, A2, A3 and B1, B2 and B3 correspond to the signal traces found on the timing diagrams of FIG. 5. Processing through the above components creates an output 26.

The input clock signal 12 is received by the differential limiting amplifier 16. The differential limiting amplifier 16 produces a copy of the clock input signal. This copy of the signal has a fixed rise/fall time output and with fixed voltage levels for the logical high and low values. By copying the timing of the clock input signal a fixed, repeatable edge shape at the signal output is created, independent of any non-timing aspect of the input signal. If the input signal is not square (e.g. rounded-off or sinusoidal), differential limiting amplifier 16 squares it and fixes the will output rise/fall times. This permits the edge shaping circuits 18 to have the same input signal characteristics allowing the edge shaping circuits to be simple analog filters, for example low-pass filters. The edge shaping circuits 18 thus are able to produce known edge shapes (e.g. rise/fall times) at their outputs.

The phase modulation in accordance with this exemplary embodiment illustrated in FIG. 1 moves the threshold of the down-stream divide-by-2 flip flops up and down against these edge controlled transition shapes. Therefore, in combination with the differential limiting amplifier 16, the circuit 10 makes these shapes as linear as possible as well as being repeatable.

Upon the shape of the pulse edge being formed by the components described above, the resultant signal is presented to the clocking input of the toggle t-type flip flop circuits 20 and 22. It will be appreciated that both the positive (true input) leg 17 and negative (inverted input) leg 19 of the edge shaping circuit 18 in the exemplary embodiment shown in FIG. 1 are done simultaneously.

The toggle-type t-flip flops 20 and 22 toggle their output logic state (from high to low or from low to high) each time there is a rising edge of the signal. It will be appreciated by those skilled in the art that this occurs with respect to the true differential input as compared to the inverted differential input. Thus, when the sum of the voltage on the true input minus the voltage on the inverted input goes from negative (the inverted input is higher in voltage than the true input) to positive (the true input is higher in voltage than the inverted input) the logic state of the flip flop will toggle.

The edge shaping outputs are both connected to the true sides of each of the toggle t-type flip flops 20 and 22 at their inputs. The flip flop 20 will toggle as a result of the rising edges of the applied input signal and the flip flop 22 will toggle as a result of the falling edges of the applied input signal. Each of the flip flops 20 and 22 respond to different edges in order to avoid duty cycle distortion. The duty cycle distortion will be understood more fully with respect to the description of FIG. 4.

In the exemplary embodiment shown in FIG. 1, voltage changes on the modulation input have the effect of moving the time that either of t-type flip flops 20 or 22 makes the decision to toggle its output state. The amount of time that the decision is moved is a function of the applied modulation voltage and the slope of the edges coming from the edge-shaping circuits. As long as the slopes of the signals coming from the edge shaping circuits are linear (or nearly linear), the time delays introduced by the modulation input will also be linear.

Once both the rising edges (flip flop 20) and the falling edges (flip flop 22) are suitably moved in time to correspond to the modulation input voltage, then they can be re-added to create the output signal. This re-adding is accomplished by the exclusive-OR logic gate 24. The exclusive-OR logic gate 24 is at logic 1 when the two logic levels of the inputs are different. This means that every edge present on either input of the exclusive-OR gate 24 will cause an edge on the output of the exclusive-OR gate 24. Rising edges that are modulated in time because of the time shift introduced by moving the decision time for the flip flop 20 to change state will also cause output of edges in the exclusive-OR gate 24 output signal. Similarly, falling edges that are moved (modulated) through the flip flop 22 will also cause moving edges in the output of the exclusive-OR gate 24. In this fashion the exclusive-OR gate 24 output will have a copy of the input clock or data signal with the edges modulated as a function of the input modulation signal.

FIG. 2 illustrates another exemplary embodiment of the present invention, namely a phase modulation circuit, generally denoted by the numeral 50. The circuit 50 embodiment is similar to the exemplary embodiment of FIG. 1, namely circuit 10. The circuit 50 accomplishes the same resulting output, namely creating a copy of the edges present in the input clock or data signal. However, in circuit 50, the edges are modulated in phase according to the modulation input signal. In this embodiment, only one logic level state is required for the input clock or data signal. There is no inverted logic state in circuit 50. Instead circuit 50 includes the modulation input being translated to a differential signal (both true and inverted copies).

Circuit 50 includes the input clock (or data) signal 12 providing the input to the limiting amplifier 16 to achieve a fixed edge rate output. This fixed edge rate output is then supplied to a edge shaping circuit 18, for example a low-pass filter. The output of the edge-shaped signal is provided to both toggle t-type flip flops 20 and 22. The flip flop 20 is provided with the true input of the toggle t-type flip flop and the flip flop 22, is provided with the inverted input.

As in circuit 10, the flip flop 20 will toggle as a result of the rising edges of the applied input clock signal 12 and the flip flop 22 will toggle as a result of the falling edges of the applied input clock signal 12.

To accomplish the edge phase modulation, the modulation input 14 is provided to the differential output linear amplifier that will generate both a true and inverted linear copy of the modulation input signal. Both true and inverted linear copies of the modulation input signal 14 are required. Each of the true and inverted modulation input signals are sent to the two toggle t-type flip flops 20 and 22. The true output of the modulation input signal 14 is provided to the inverted input of the flip flop 20, while the inverted copy of the modulation input signal 14 is supplied to the true input of the flip flop 22. In this way, a rising voltage on the modulation input signal 14 will cause a somewhat later decision in the flip flop 20 (to cause a change in the output state) and, as well, a falling voltage in the inverted copy of the modulation input signal 14 will similarly cause a somewhat later decision on the flip flop 22.

In circuit 50, the flip flop 20 will hold modulated edges that stem from the rising edges of the input clock signal 12 and the flip flop 22 will hold modulated edges that stem form the falling edges of the input clock signal 12. Once the signals acquire modulated edges corresponding to both rising and falling edges are present, the signals are added using the exclusive-OR gate 24 to create an output signal that includes all edges being modulated as a function of the modulation input.

FIG. 3 illustrates the need for a pulse shaping circuit, such as circuits 10 and 50 of FIGS. 1 and 2. As will be appreciated upon review of FIG. 3, the pulse shaping circuits 10 and 50 extend the range of the linear modulation of the phase modulator in accordance with the method and apparatus of the invention.

FIG. 3 illustrates in graphic form three waveforms that are presented as the edge of the clock (data) signal to both toggle t-type flip flops 20 and 22. Specifically, FIG. 3 shows a sinusoidal shape response 60, a typical R-C filter type response 62 and a nearly square signal shape 64. In each example, the graph illustrates that portion of the edge is presented as linear and the range as a percent of the entire bit period.

It will be appreciated that over the time range graphically shown that moving the decision point up and down at the input to the toggle t-type flip flops 20 and 22 will be able to delay a decision.

As will be appreciated by those skilled in the art, a sinusoidal shape is relatively easy to create. However, such a shape gives a linear range of around 25% of the bit period. The R-C shape extends the range further. It will be appreciate that such a shape is implemented as a single-pole filter.

It is clearly graphically shown that using a square (or nearly square) edge shape creates a very short time modulation range which corresponds to the very short time of the edge rate.

Figure 4:
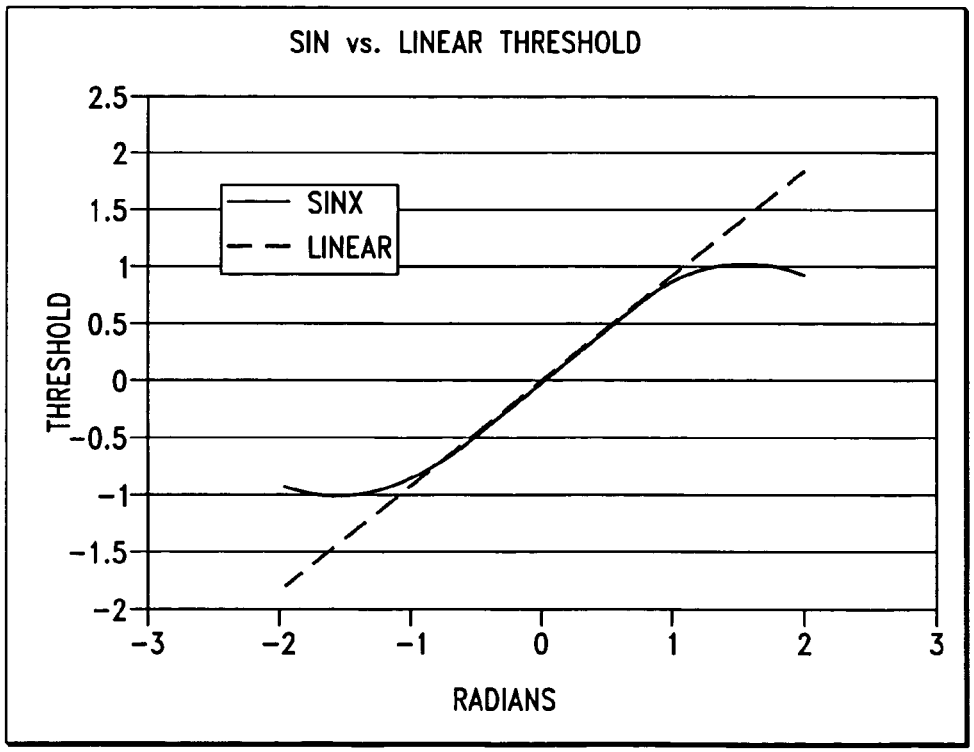
FIG. 4 illustrates a schematic representation of the near-linear tuning range of a sine-wave preconditioning signal.

FIG. 4 illustrates graphically, a zoomed-in view of a near linear range present in a sinusoidal response. As shown in FIG. 4, a straight line is compared to the curvy shape of a sinusoid. As illustrated the range is approximately 25% of the sine period, while the linearity is within acceptable ranges. As the range is pushed to around 29%, it will be seen in FIG. 4 that the linearity drops.

From, real world experience a 25% range corresponds to a linearity that is within +/−2% of true. However, extending the range to a 29% range decreases the linearity to a tolerance of +/−5%.

In the prior art, modulation of a clock or data waveform has been attempted by using a differential input to move the time of a logical decision backward and forward in time as a function of the modulation input. See, Working Draft dated Feb. 21, 2002 of the *Fiber Channel—Methodologies for Jitter and Signal Quality Specifications—MJSQ* which is an ANSI standard T11.2/Project 1316-DT/Rev 5.0, which is specifically incorporated herein by reference. Particularly relevant to this discussion is the text at page 38. In the prior art, a limiting amplifier was used. The limiting amplifier would have output transitions for both rising and falling edges. This is unlike the instant invention, where the toggle t-type flip flop only transitions as a function of the rising edges of the input signal. Using an apparatus in accordance with the prior art, the rising edge of the input signal is delayed by a rising voltage on the modulation input as desired. However, simultaneous with this, the falling edge of the input clock or data signal is shifted earlier in response to a rising voltage on the modulation input. The net effect creates a duty-cycle modulation. It will be appreciated that duty cycle modulation is not the same as phase modulation.

Figure 5:
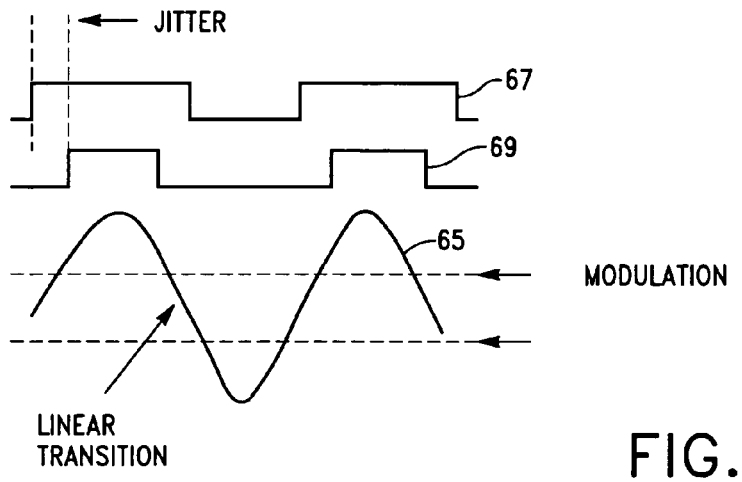
FIG. 5 illustrates a schematic representation of the duty-cycle modulation present in the limiting amplifier modulator techniques in accordance with the invention.

FIG. 5 illustrates the duty cycle distortion created by prior art attempts to create phase modulation. In FIG. 5, an input clock signal is shown as a near sine-shaped signal 65. The signal is compared at the two extremes of the modulation range. As shown a jitter is created on the output signal. Also as shown, the two output signals 67 and 69 at one extreme of the modulation range we have a fat logic 1 and a narrow logic 0 and at the other modulation range extreme we have a narrow logic 1 and a fat logic 0. As will be appreciated this known method while creating a jitter also creates a duty cycle distortion.

Figure 6:
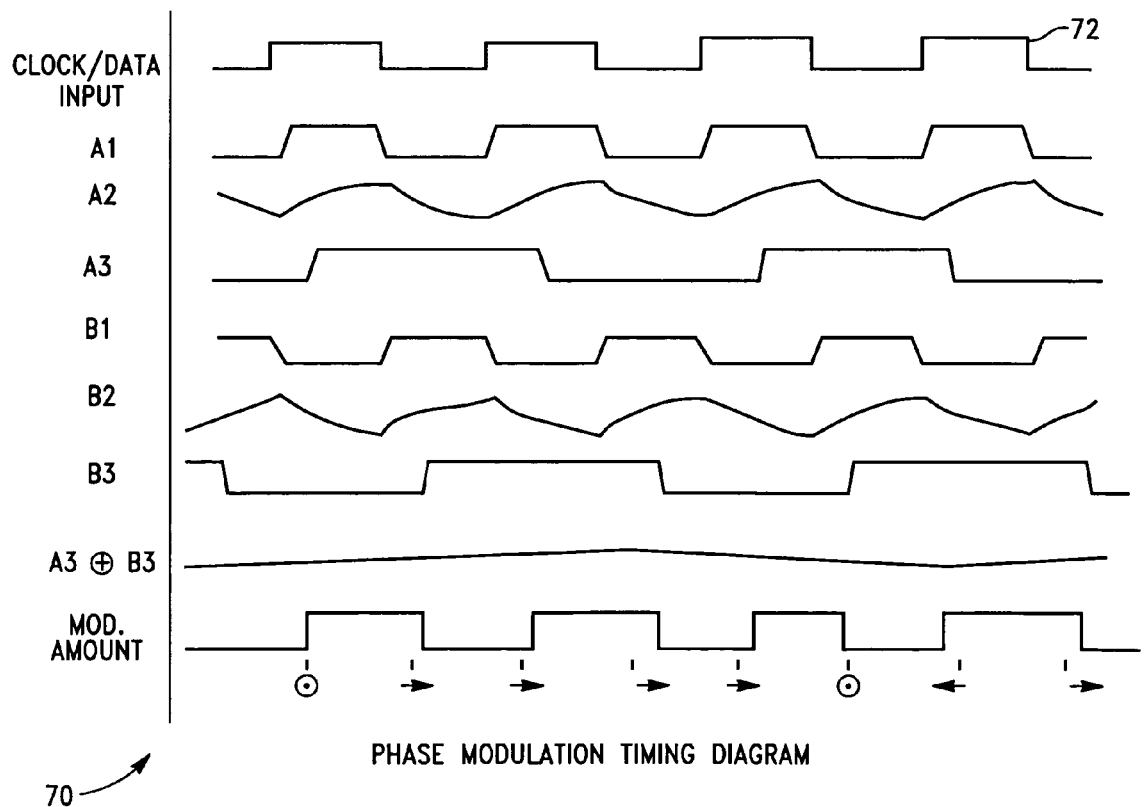
FIG. 6 is a graphic representation of the timing diagram in accordance with the invention

With respect to FIG. 6, there is shown the timing diagram created circuit 10 of FIG. 1. The top trace represents the input clock (or data) signal 12 shown as a near square-shaped signal. As noted above less-than-square signals are within the spirit and scope the instant invention with acceptable results.

This input signal 12 is presented to the differential output limiting amplifier which creates outputs A1 and B1. These signals now have a fixed edge rate (here shown as trapezoidal). B1 is the logical inversion of A1. Both A1 and B1 are then input to their own pulse shaping circuits to create outputs A2 and B2. In the example shown in FIG. 6, an R-C type response is shown as the output of the pulse shaping circuit. Other pulse shaping circuits are also within the spirit and scope of the invention. However, this choice provides a large linear-like range for modulation.

The two toggle type t-flip flops 20 and 22 accept the A2 and B2 signals and compare their two inputs to the modulation input to derive their outputs. The edges of their outputs are shifted with respect to each other because the A2 signals are used to derive output edges corresponding to the rising edges of the input signal and the B2 signals are used to derive outputs corresponding to the falling edges of the inputs signal. The exact time of when the output flip flop will change state depends on when the signal (A2 or B2) gets above or below the modulation input voltage. This will occur when modulation is accomplished.

The output of the present invention is created by using an exclusive-OR gate 24 to re-combine the A3 and B3 signals (the outputs of the two toggle t-type flip flops 20 and 22). The small arrows below the edges shown on the exclusive-ored output signal showing the direction and amount of modulation for each edge which corresponds to the amplitude of the modulation input at that time.

While the foregoing detailed description has described several exemplary embodiments of the specific method and apparatus for creating phase modulation in edge-sensitive signals, it is to be understood that the above description is illustrative only and is not limiting of the disclosed invention. Particularly other configurations are within the scope and sprit of this invention. Thus, the invention is to be limited only by the claims set forth below.

What is claimed is:

1. A phase modulation circuit, comprising:
    a sampling circuit operative to provide a fixed edge differential signal in response to an input signal;
    at least two edge shaping circuits, each coupled to a respective leg of the differential signal, operative to provide a corresponding shaped signal having a fixed rise/fall time.
    at least two modulation circuits operative to simultaneously provide phase modulated versions of the differential signal in response to an adjustable modulation input signal; and
    an output circuit operative to provide a phase modulated copy of the input signal in response to the modulated versions of the differential signal; and wherein the at least two modulation circuits further includes a t-type flip flop operative to sample and provide the shaped non-inverted signal in response to the modulation input signal, such that the t-type flip flop will toggle on the rising edge of the non-inverted signal upon a predetermined voltage transition measured as the difference between the non-inverted signal voltage and the modulation input signal voltage.

2. The phase modulation circuit of claim 1, wherein the sampling circuit further comprises a differential limiting amplifier operative to provide a non-inverted copy of the input signal and an inverted copy of the input signal, each of the true copy of the input signal and the inverted copy of the input signal having square edges.

3. The phase modulation circuit of claim 1, wherein the square edges provided by the differential amplifier are generated independent of the shape of the input signal.

4. The phase modulation circuit of claim 1, wherein the at least two edge shaping circuits further includes a first edge shaping circuit operative to provide a fixed rise time signal in response to the non-inverted copy of the input signal.

5. The phase modulation circuit of claim 4, wherein the at least two edge shaping circuits further includes a second edge shaping circuit operative to provide a fixed fall time signal in response to the inverted copy of the input signal.

6. The phase modulation circuit of claim 1, wherein the at least two edge shaping circuits comprise analog filters.

7. The phase modulation circuit of claim 6, wherein the analog filters further comprise low-pass filters.

8. A phase modulation circuit, comprising:
a sampling circuit operative to provide a fixed edge differential signal in response to an input signal;
at least two edge shaping circuits, each coupled to a respective leg of the differential signal, operative to provide a corresponding shaped signal having a fixed rise/fall time;
at least two modulation circuits operative to simultaneously provide phase modulated versions of the differential signal in response to an adjustable modulation input signal; and
an output circuit operative to provide a phase modulated copy of the input signal in response to the modulated versions of the differential signal,
wherein the at least two modulation circuits further includes a t-type flip flop operative to sample and provide the shaped inverted signal in response to the modulation input signal, such that the t-type flip flop will toggle on the falling edge of the inverted signal upon a predetermined voltage transition measured as the difference between the inverted signal voltage and the modulation input signal voltage.

9. The phase modulation circuit of claim 1, wherein the output circuit is an exclusive-OR gate operative to provide a copy of the input signal with modulated edges in response to the modulated signals from the first flip flop and the second flip flop, respectively.

10. A phase modulation circuit, comprising:
a sampling circuit operative to provide a fixed edge rate output signal in response to an input signal, the shape of the fixed edge being independent of the shape of the input signal;
an edge shaping circuit operative to provide a signal having a fixed rise/fall time in response to the fixed edge rate output signal;
a differential amplifier circuit operative to provide a differential modulation signal in response to an input modulation input signal;
a first flip flop having a first input coupled to the output of the edge shaping circuit and a second input coupled to the non-inverted version of the differential modulation signal, the first flip flop operative to sample and provide a modulated non-inverted signal in response to the non-inverted version of the differential modulation signal;
a second flip flop having a first input coupled to an inverted version of the output of the edge shaping circuit and a second input coupled to the inverted version of the differential modulation signal, the second flip flop operative to sample and provide a modulated inverted signal in response to the inverted version of the differential modulation signal;
an output circuit operative to provide a phase modulated copy of the input signal in response to the outputs of the first and second flip flops, respectively; and
wherein the at least two flip flops further includes a t-type flip flop operative to sample and provide the shaped inverted signal in response to the modulation input signal, such that the T-Type flip flop will toggle on the falling edge of the inverted signal upon a predetermined voltage transition measured as the difference between the inverted signal voltage and the modulation input signal voltage, the toggling of the second flip flop being simultaneous to the toggling of the first flip flop.

11. The phase modulation circuit of claim 10, wherein the sampling circuit further comprises a differential limiting amplifier operative to provide a non-inverted copy of the input signal having square edges.

12. The phase modulation circuit of claim 1, wherein the output circuit is an exclusive-OR circuit operative to provide the modulated input signal in response to the modulated signals from the first flip flop and the second flip flop, respectively.

13. The phase modulation circuit of claim 10, wherein the first flip flop provides the modulated non-inverted signal in response to the rising edge of the shaped input signal and a predetermined voltage transition measured as the difference between the shaped input signal voltage and the non-inverted version of the differential modulation signal.

14. The phase modulation circuit of claim 13, wherein the second flip flop provides the modulated inverted signal in response to the falling edge of the shaped input signal and a predetermined voltage transition measured as the difference between the shaped input signal input voltage and the inverted version of the differential modulation signal.

* * * * *